United States Patent [19]
Xu et al.

[11] Patent Number: 6,118,141
[45] Date of Patent: Sep. 12, 2000

[54] EMITTER-SWITCHED THYRISTOR

[75] Inventors: Shuming Xu; Rainer Constapel, both of Frankfurt am Main, Germany; Jacek Korec, San Jose, Calif.

[73] Assignee: Vishay Semicondcutor GmbH, Heilbronn, Germany

[21] Appl. No.: 09/269,599

[22] PCT Filed: Sep. 20, 1997

[86] PCT No.: PCT/EP97/05165

§ 371 Date: Mar. 22, 1999

§ 102(e) Date: Mar. 22, 1999

[87] PCT Pub. No.: WO98/12749

PCT Pub. Date: Mar. 26, 1998

[30] Foreign Application Priority Data

Sep. 21, 1996 [DE] Germany ............... 196 38 769

[51] Int. Cl.[7] .................................................. H01L 29/74
[52] U.S. Cl. .................... 257/133; 257/137; 257/146
[58] Field of Search ............................ 257/133, 137, 257/146, 162, 163

[56] References Cited

U.S. PATENT DOCUMENTS

| | | | |
|---|---|---|---|
| 5,498,884 | 3/1996 | Ajit | 257/137 |
| 5,665,988 | 9/1997 | Huang | 257/133 |
| 5,780,917 | 7/1998 | Mori | 257/487 |

FOREIGN PATENT DOCUMENTS

| | | |
|---|---|---|
| 0675545A2 | 4/1995 | European Pat. Off. . |
| 0736910A2 | 10/1996 | European Pat. Off. . |
| 19508510A1 | 11/1995 | Germany . |
| 598439 | 5/1996 | Switzerland . |
| 94/06158 | 3/1994 | WIPO . |

OTHER PUBLICATIONS

Bhalla, Anup et al. "RECEST: A Reverse Channel Emitter Switched Thyristor", Proceedings of 1995 International Symposium on Power Semiconductor Devices & ICs, Yokohama, Japan, pp. 24–28.

Shekar, M.S. et al. "High–Voltage Current Saturation in Emitter Switched Thyristors", IEEE Electron Device Letters, vol. 12, No. 7, pp. 387–389, Jul. 1991.

*Primary Examiner*—Ngân V. Ngô
*Attorney, Agent, or Firm*—Venable; George Spencer; Norman N. Kunitz

[57] ABSTRACT

In an emitter-switched thyristor with a main thyristor (TH) composed of a p+ anode emitter (1), a drift zone (3') of opposite conductivity type, a zone (4) which has in the switched-off state a blocking zone with respect to zone (3) and an emitter zone (5) at the cathode side, again with an opposite conductivity type, so that a p+n–pn+ zone sequence results, a transistor structure (T) composed of the first three zones of alternating conductivity is provided in parallel thereto with an emitter (1), base (3) and a collector (8). This structure contains a NMOSFET (M1) for directly driving the cathode emitters (5) through the cathode connection (KA). The source of this transistor is contacted by the cathode, as well as the collector zone (8) which forms the channel zone of the MOSFET at the surface of the semiconductor. The corresponding drain zone is connected to the n+ cathode emitter (5) of the main thyristor (TH) by an electric conductor (6). A switching-in DMOSFET (M2) is further provided whose gate (G2) is connected to the gate (G1) of the NMOSFET (M1), a source (S2) contacted by the cathode (K) and embedded in a p-base. A conductive connection is established with the cathode contact of the switching-in NMOSFET (M1), and the common connection extends up to a cathode connection (KA). A drain zone (D2) is embedded in the drift zone (3) and the substrate zones of M1 and M2 are in contact with the cathode. The structure contains a PMOSFET (M3) whose gate is connected to the cathode, whose drain (D3) forms a part of the collector zone (8) of the transistor (T) for the secondary current, whose source zone is connected to the base zone (4) of the main thyristor (TH) next to the cathode and whose substrate zone is formed by a part of the n-doped zone (3) adjacent to the surface of the component.

6 Claims, 6 Drawing Sheets

EMITTER-SWITCHED THYRISTOR

BACKGROUND OF THE INVENTION

The invention relates to an emitter-switched thyristor, having a main thyristor, which is formed from a p+ anode emitter, a drift zone having an opposing conduction type, a zone which, in the turned-off state of the thyristor, has a blocking zone with respect to the drift zone, and a cathode-side emitter having, again, a reversed conduction type resulting in a zone sequence p+n–pn+; a transistor structure, which is parallel to the main thyristor and comprises three regions of alternating conductivity types: an emitter, which is identical to the p+ anode emitter, an n-doped zone as a base, and a collector region; and, an NMOSFET for direct actuation of the cathode emitter, with the source of this transistor, like the collector region, being contacted by a cathode, which is connected to a cathode connector.

An advantage of emitter-switched thyristors is that they can easily be controlled via a gate having a low voltage drop. Most ESTs (Emitter-Switched Thyristors) have no pronounced current saturation, because the saturation is limited by the breakdown voltage of the turn-on MOSFET, which is switched in series with the main thyristor. The ESTs having a twin channel have the disadvantage of a high voltage drop in the forward direction. A MOSFET of this type is described in the publication of M. S. Shekar, B. J. Baliga, M. Nandakumar, S. Tandon and A. Reisman: "High-Voltage Current Saturation in Emitter Switched Thyristors," IEEE ELECTRON DEVICE LETTERS, VOL. 12, NO. 7, JULY 1991.

The publication of A. Bhalla, T. P. Chow, K. C. So: "RECEST: A Reverse Channel Emitter Switched Thyristor," ISPSD-95, Proc. Int. Symp. on Power Semic. Dev. and ICS, 1995, Yokohama, pp. 24–28, discloses an emitter-switched thyristor that forms a main thyristor between a "floating" n+ emitter, a p trough, an n drift region, an n buffer zone and a p+ substrate. The floating n+ emitter is short-circuited to the n+ drain region of the lateral, series-connected MOSFET by a floating metal connection. The thyristor current is thereby forced to flow through the series MOSFET. A parasitic thyristor is present between the n+ source, the p trough, the n drift region, the n buffer zone and the p+ substrate. Both parts of the gate are connected to the boundary of the cell, which forms an approximately 100– m-long strip in the z direction. The p trough under the floating n+ emitter is short-circuited in the z direction to the p+ region and the cathode at the boundary of the cell of the individual component (see FIG. 1).

Turn-on is effected by the application of a positive voltage to the gate and a positive bias voltage to the anode. The gate effects electron inversion layers under the lateral series MOSFET and the DMOS gate. The electrons flow from the cathode and into the drift region via the lateral series MOSFET, the floating metal connection, the floating n+ emitter and the DMOS channel. This in turn effects the injection of holes from the p+ substrate, a few of which are captured by the p trough. This hole current flows under the floating n+ emitter in the z direction, and polarizes the n+/p trough transition in the forward direction, and turns on the main thyristor. Because the lateral series MOSFET is regarded as the sole source of electrons for the floating n+ emitter (via the floating metal connection), the entire thyristor current must flow through the series MOSFET. This leads to a gate-switched current saturation in the turned-on state.

To turn off the component, a negative voltage is applied to the gate. The gate turns off the lateral series MOSFET and activates the p-channel MOSFET, which bypasses the hole current. This produces a path for the hole current from the p trough to the cathode contact. Because this hole current does not flow under the n+ source, the dynamic latching of the parasitic thyristor is suppressed. To the extent to which the anode voltage increases during turn-off, the potential of the JFET region will increase prior to the recovery of the transition between the p trough and the n drift region. Even if the gate is maintained at zero Volts, a p-type inversion layer is induced. Because the region of the p trough is likewise at a fairly-high potential (10–20 V), the PMOS distributer is activated, and the holes are led away via this path.

Some mechanisms for the malfunction of the component during turn-off have been established for emitter-switched thyristors. Examples include latching of the parasitic thyristor, breakdown of the lateral series MOSFET, breakdown in the z direction of the transition between the p trough and the n+ region at the boundary of the individual component cell, and current-induced avalanche breakdown at high voltages. This component can also be destroyed by one of these mechanisms, depending on the following design and operating conditions:

1. The current density for the latching of the parasitic thyristor can be brought to a higher level by the reduction in the dimensions of the regions on the right side of the p+ region of the distributor MOSFET.
2. During turn-off, the potential of the floating n+ emitter increases with the potential of the p trough, whereas it follows the anode potential before the transition between the p trough and the n+ emitter region has recovered. Because the floating n+ emitter region is short-circuited to the drain region of the lateral series MOSFET, this can result in the breakdown of the MOSFET.
3. When the PMOS distributor is activated, the hole current, which flows through the p channel, constructs a lateral voltage drop after being captured by the ptrough region. This voltage drop is the most positive on the left side of the component (see FIG. 1, center of the floating emitter region). Because the potential of the floating n+ emitter is limited to the diode drop of the very-positive p-trough potential, the transition from the p trough to the n+ region, starting from the center of the floating emitter and increasing up to the JFET region, is polarized in the blocking direction. Now, however, the region of the p trough is short-circuited to the cathode in the z direction. The bias voltage at the transition between the n+ emitter region and the p trough at the cell boundary is larger by the voltage drop over the PMOS channel than under the DMOS gate. This voltage drop can be large enough to lead to a breakdown of the transition under the gate. The breakdown of this transition will begin at the cell boundaries, very likely at the spatial transitions embodied at the corners of the floating emitter window.

In addition to the destruction caused during turn-on by the blocking polarization of the floating n+/p trough transition, and the aforementioned avalanche breakdown, known emitter-switched thyristors have the disadvantage that, in the turned-on state, the saturation of the anode current can only be effected by the saturation of the lateral NMOSFET. To attain a good saturation, the NMOSFET must have a high breakdown voltage. This, however, significantly increases its resistance in the turned-on state, and thus increases the voltage drop over the turned-on thyristor. During turn-off, the voltage drop in the lateral NMOSFET increases, and threatens to destroy the NMOSFET. The voltage drop is basically determined by the resistance in the turned-on state of the p channel in the JFET region. In this component, referred to as RECEST, the p channel is embodied as a longitudinal channel, and its "on" resistance is therefore very high.

BRIEF SUMMARY OF THE INVENTION

It is an object of the invention to reduce the voltage drop over the transition between the p trough and the floating n+ region. It is a further object of the invention to reduce the voltage drop over the lateral NMOSFET, and to maintain the saturation of the anode current in the turned-on stage, even with high anode voltages.

The above object generally is achieved according to the present invention by an emitter-switched thyristor having a main thyristor, which is formed from a p+ anode emitter, a drift zone having an opposing conduction type, a zone which, in the turned-off state of the thyristor, has a blocking zone with respect to the drift zone, and a cathode-side emitter having, again, a reversed conduction type, resulting in a zone sequence p+n–pn+; a transistor structure, which is parallel to the main thyristor and comprises three regions of alternating conductivity types including an emitter, which is identical to the p+ anode emitter, an n-doped zone as a base, and a collector region; an NMOSFET for direct actuation of the cathode emitter, with the source of this transistor, like the collector region of the transmitter, being contacted by a cathode, which is connected to a cathode connector; a turn-on DMOSFET, whose gate is connected to the gate of the NMOSFET; a source, which is likewise contacted by the cathode, and is embedded in a p base that is identical to the collector region; a drain region, which is embedded in the n-doped zone, with the channel region of the DMOSFET being disposed in the collector region; and a PMOSFET, whose gage is connected to the cathode and whose drain is a part of the collector region, whose source region is connected to the zone of the main thyristor, and whose channel region is formed by a part of the n-doped zone that borders on the component surface.

An advantage of the thyristor according to the invention is that the MOS-switched thyristor has a safe operating range, with the saturation behavior of the anode current protecting the component against overstressing. The component can be turned on by unipolar potentials; the p base 4 can float, that is, its potential is not established externally.

In addition to a main current path, the MOS-switched thyristor of the invention also includes a secondary current path.

The main current path comprises a thyristor structure having the following regions: a p+ anode emitter, an n drift zone, a p base, n+ emitter and a downstream turn-off MOSFET (NMOS). The cathode side of this thyristor possesses no short-circuit between the p base and the cathode. For turning on the thyristor, a DMOSFET is provided, whose gate is short-circuited to the gate of the NMOS. This main current path approximately corresponds to the conventional EST, but with a backward-oriented turn-on channel (DMOS).

The secondary current path comprises a bipolar transistor having a p+ emitter, an n drift zone and a p collector. The collector p base is connected via a p-channel MOSFET to the p base of the thyristor. The gate of this PMOS is short-circuited to the cathode K of the component. The gate thus controls itself, depending on the state of the entire component.

BRIEF DESCRIPTION OF THE DRAWING

Examples for the invention are described in detail below in conjunction with the drawing. Shown are in.

DETAILED DESCRIPTION OF THE INVENTION

Figure 1:
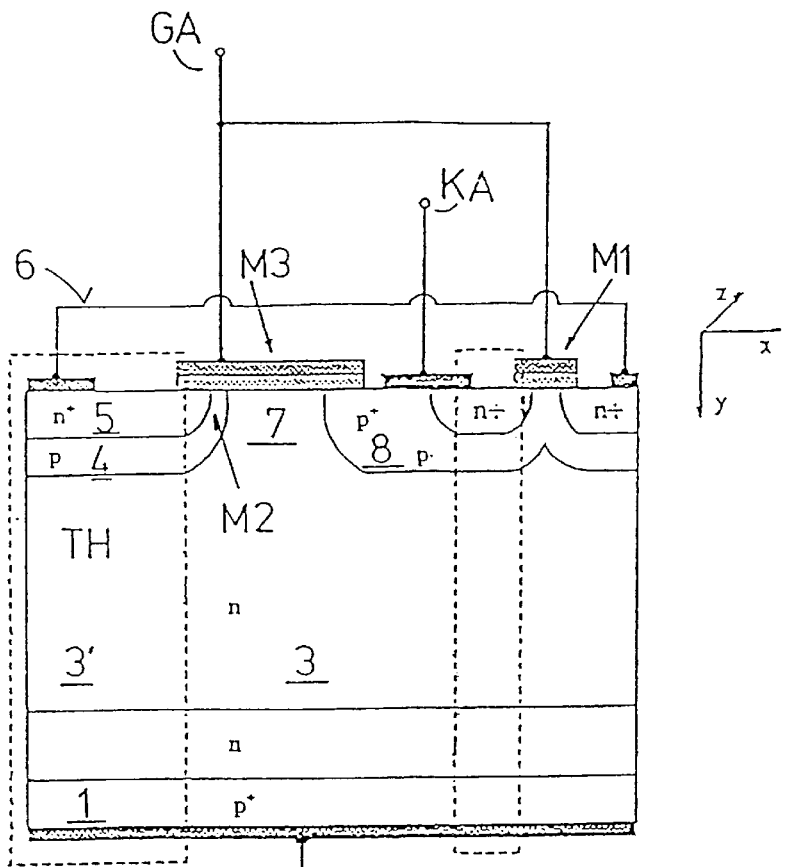
FIG. 1 a RECEST component according to the state of the technology.
Figure 2:
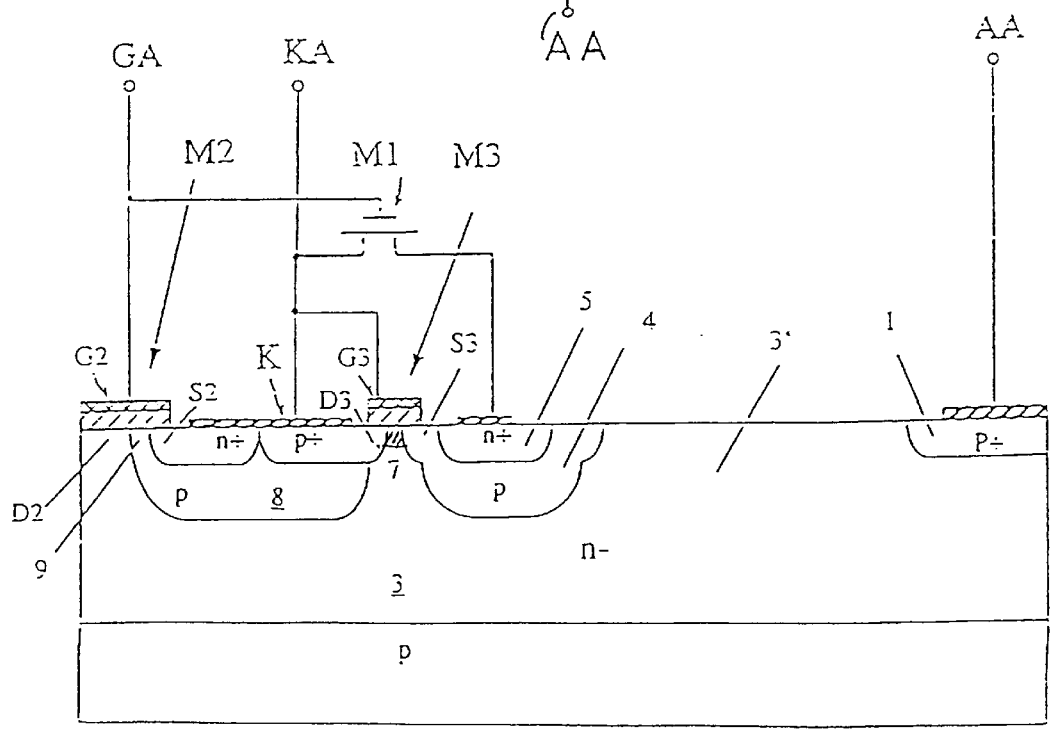
FIG. 2 the basic structure of the component of the invention.

FIG. 2 shows a cross-section of the basic structure of the component according to the invention. This basic structure can also be seen in the equivalent circuit diagram in FIG. 3a. The emitter-switched thyristor of the invention has a parallel lateral IGBT T, which is parallel to its thyristor structure TH, and is switched in series with a lateral NMOSFET M1, as in all conventional lateral, emitter-switched thyristors. Its function is described below. The component according to the state of the technology, which is shown in FIG. 1, has a different structure; its distinction from the invention is clarified through a comparison of the corresponding equivalent circuit diagrams 3a and 3b.

Figure 3A:
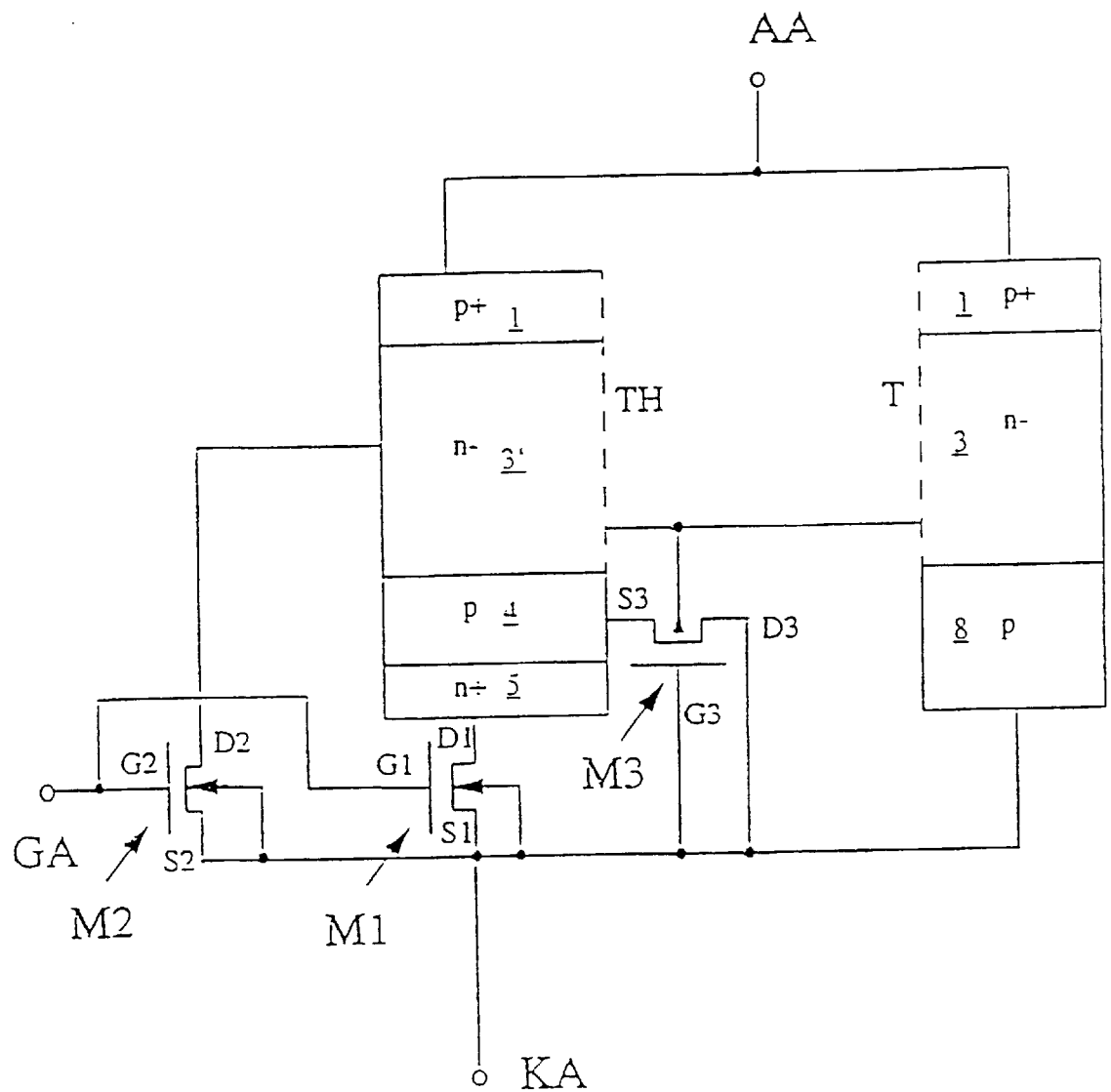
FIG. 3 the equivalent circuit diagram for FIG. 2, for comparison with the equivalent circuit diagram of the component according to the state of the technology.
Figure 3:
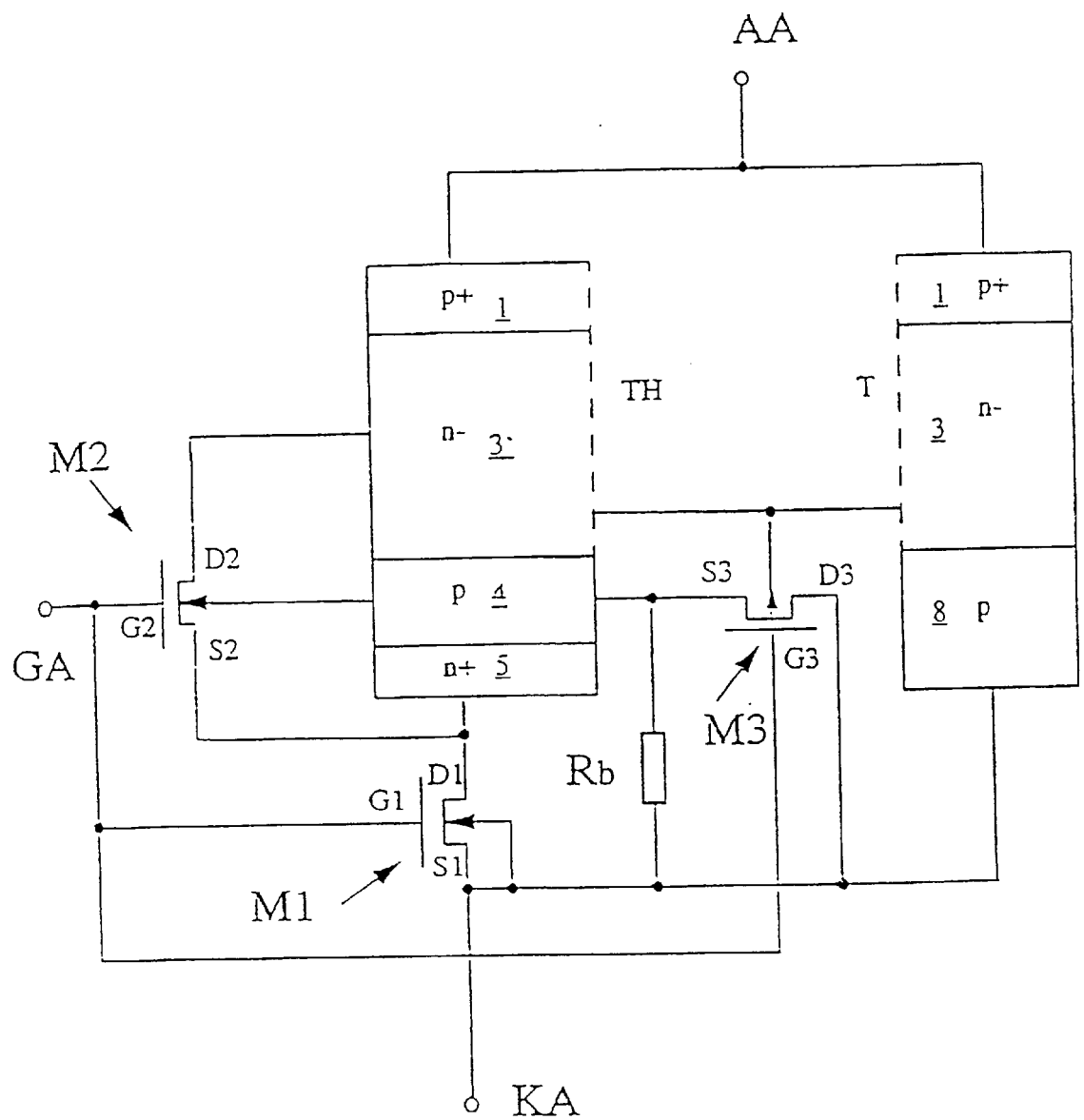

An embodiment according to FIGS. 2 and 3a, which is especially preferred for SOI components, has in a substrate S a lateral insulation layer I, above which a lateral thyristor element TH is located. The thyristor element includes a first emitter zone 1, which has a p conductivity and is contacted by the anode layer A, which is surrounded here by an n buffer zone 2, for example; a first base zone 3 having an n conductivity and a drift zone 3'; a second base zone 4 having a p conductivity; a second emitter zone 5, which has an n conductivity and is connected to the drain of the N MOSFET M1; and a further base zone 8, which is separated from the base zone 4 and has a p conductivity, and in which the source S2 of M2 is embedded as an n+ region and which is contacted by the cathode K.

Figure 4:
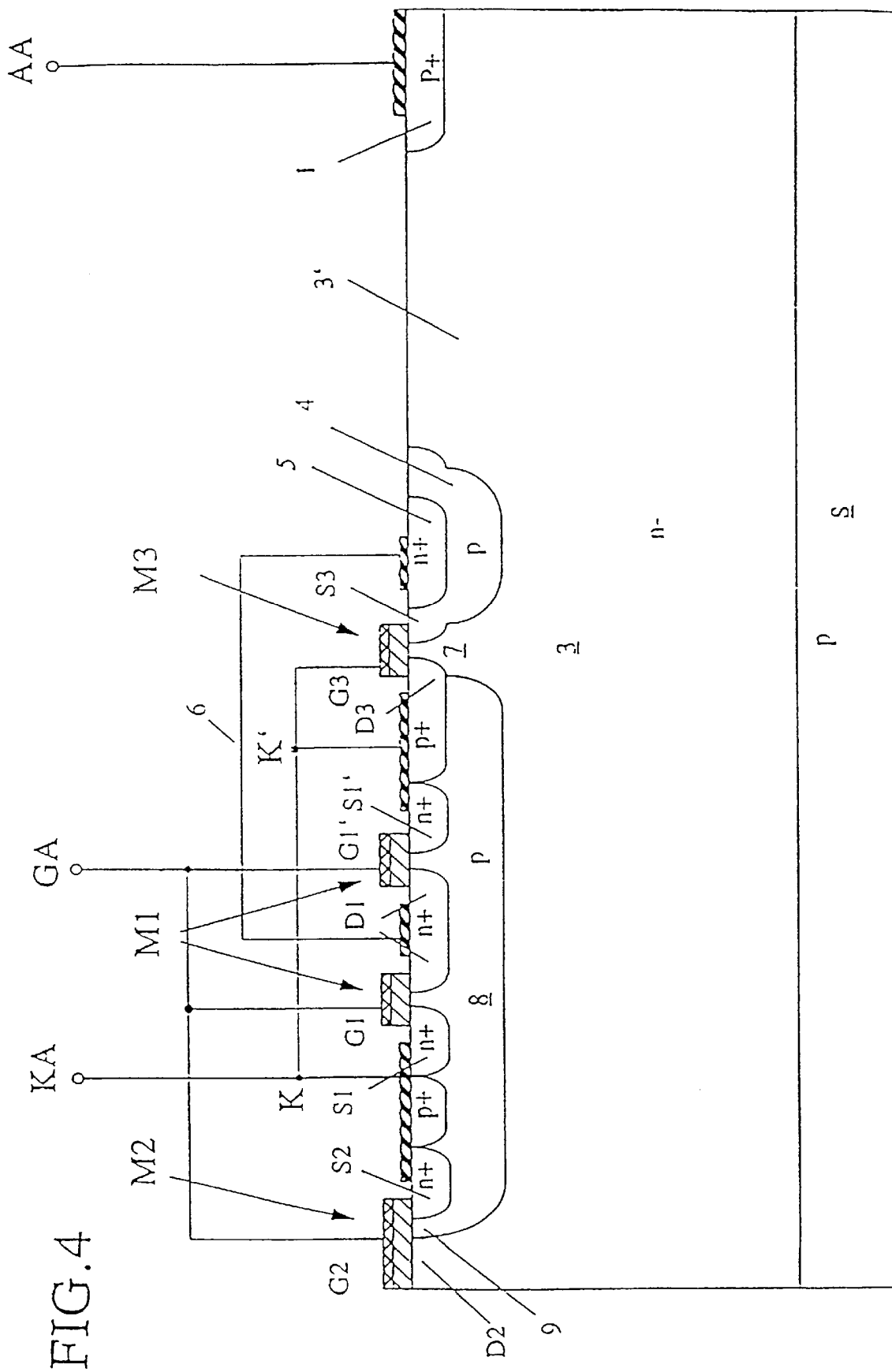
FIG. 4 a lateral embodiment with an integrated lateral NMOSFET.

FIG. 4 shows the integration of M1 into the p trough 8 of the component. To reduce the resistance, two MOSFETs M1 and M1' having a common drain region D1 are switched in parallel and connected via the conducting track 6 to the cathode-side emitter zone 5 of the main thyristor. The n+ source regions S1 and S1' are contacted by the cathodes K and K', respectively. The gate G1 is interconnected with the gate G2, and connected to the gate connector GA.

In addition to the NMOSFET M1, a DMOSFET M2 is provided; its gate G2 is short-circuited to the gate G1 of the NMOSFET M1. The gate layer of the MOSFET M2 is located above the base zone 3 leading through, as a drain zone D2, to the component surface; above the p base zone 9 leading through to the surface; and above a portion of the component cathode leading through, as a source, to the surface. A third MOSFET (PMOSFET) has a p base zone 4 as a source, the zone being inserted into the n base zone 3. An n zone 5 is inserted, as an emitter of the main thyristor TH, into the n base zone 3, and is contacted by a metallic layer connected to the conducting track 6. Extending from the cathode layer K is a metallic layer that is insulated by the substrate and covers a portion of the p base zone 8 that leads through, as a drain D3 of the MOSFET M3, to the surface, as well as the n base zone 3 guided through to the surface under the layer, and a portion of the p zone 4. The gate of the MOSFET M3 is short-circuited to the component cathode.

In the equivalent circuit diagram FIG. 3a, the thyristor is represented by TH; the parallel transistor, which is formed by the p emitter zone 1, the n base zone 3 and the p base zone 8, is represented by T; and the MOSFET is represented by M1, M2, M3.

When a positive potential is applied to the anode A relative to the cathode K, and a sufficiently-positive voltage is applied to the gate electrode GA, to turn on the lateral NMOSFET M1 and the n channel DMOSFET M2, the cathode K injects electrons, which flow via the n channel of the DMOSFET M2 into the drain region D2, and via the n drift region 3 to the anode. This induces holes from the anode as soon as the anode voltage exceeds 0.7 V.

The turned-on lateral series NMOSFET M1 short-circuits the floating n+ emitter zone 5 to the cathode K. Because no current flows through the NMOSFET M1 before the thyristor is turned on, no voltage drop can occur during this short-circuit. The p base zone 4 has a low potential, and collects the holes. These holes collect on the p side of the transition from the p+ base zone 4 to the floating n+ emitter 5, and polarize this transition in the forward direction. When this bias voltage exceeds 0.7 V, the main thyristor is turned on. In the turned-on state, the main current of the thyristor flows through the lateral series NMOSFET M1, resulting in the current saturation of the NMOSFET. If, on the other hand, the anode receives a high voltage, the high potentials of the source region S3 of the parallel-switched, lateral PMOSFET M3 and the n substrate 3 ensure that the PMOSFET M3, whose gate is at cathode potential, is turned on with the aid of an inversion channel 7. The turned-on PMOSFET conducts the holes from the p base zone 4 to the cathode, limits the cathode potential and thus limits the potential of the floating n+ emitter zone 5. This means that the voltage drop from the drain to the source of the lateral NMOSFET M1 is limited by the PMOSFET M3. Thus, a very good current-saturation behavior of the component is attained.

Because of the separation of the p base zone 4 from the p base zone 8, during the turn-on process, no path is present for holes collected by the p base zone 4. Therefore, the main thyristor is supported in its turn-on behavior.

Furthermore, the lateral expansion of the floating n+ emitter zone 5 and the p base zone 4 under the n emitter zone 5 is limited to the extent that requirements of the circuit design can be considered. The final consequence of this is a reduction in the size of the component cells in the integrated circuit connection.

For turn-off of the component, the bias voltage of the gate G is reduced, with the lateral NMOSFET M1 and the n channel DMOSFET M2 likewise being turned off. Because of the continuity condition for the current, the potentials of the floating n+ emitter 5 and the p base 4, and therefore the potential of the n base region 3, increase very rapidly. If the potential of the n base 3 has increased beyond a specific value, the parallel PMOSFET M3 turns itself on. This creates a path for the holes stored in the p base 4, which flow from there to the cathode. The current through the main thyristor to the lateral PNP transistor therefore changes. The lateral PNP transistor T comprises the p+ region 1 under the anode A as an emitter, the n drift region 3' and the p base zone 8 as a collector. The PNP transistor is turned off due to the recombination of the holes with the electrons in the drift region.

During turn-off, M1 and the NMOSFET M2 are shut off. The current through the channel of the PMOSFET M3 increases because the PMOSFET turns on. The current flows directly to the cathode, i.e., it does not travel via a bypass under an n+ region. This is the primary reason for the improvement in the dynamic latching behavior of the component. On the other hand, the p base 4 can be heavily doped, and the expansion in the lateral direction can be made small, insofar as this is a primary design consideration. The result is a small voltage drop in the p base 4 during the turn-off process.

An embodiment of the invention that is only shown in a fundamental representation in FIG. 2 is shown in concrete form in FIG. 4. The NMOSFET M1 is integrated there into the p base zone (or p trough 8). The arrangement of the other components is unchanged with respect to FIG. 2.

Figure 5:
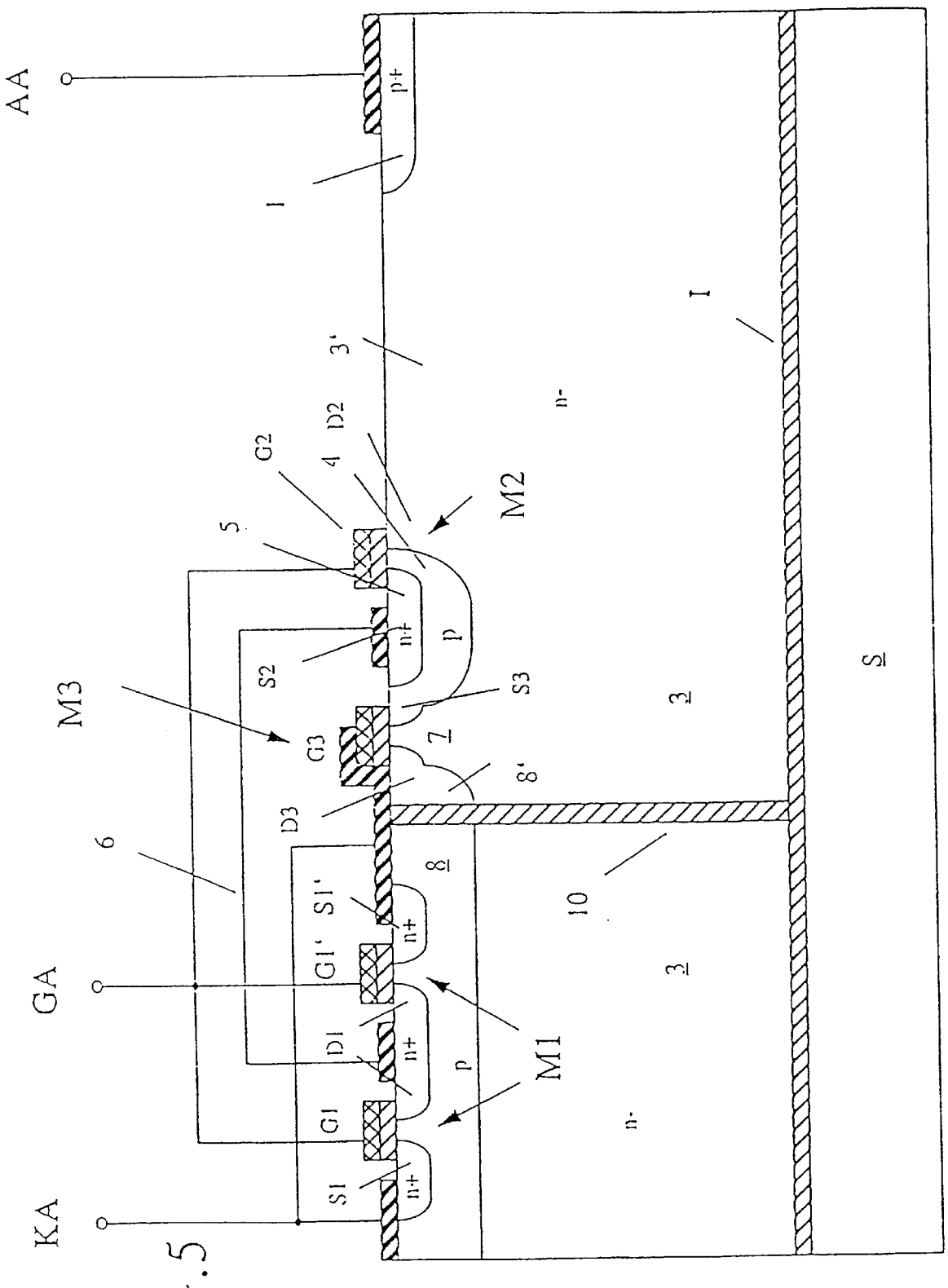
FIG. 5 the lateral embodiment of the component with an integrated lateral MOSFET and a dielectric insulation layer.

FIG. 5 shows a further example for the application and embodiment options of the invention. The special embodiment is preferably suitable for SOI components. The substrate S is insulated from the actual component by an insulation layer I. To block the current path against the latching of the parasitic transistor, a trough having an insulation layer 10 is provided. So that the current can flow through the main thyristor, however, M2 is disposed on the anode side. The known function of M2 is unchanged.

Figure 6:
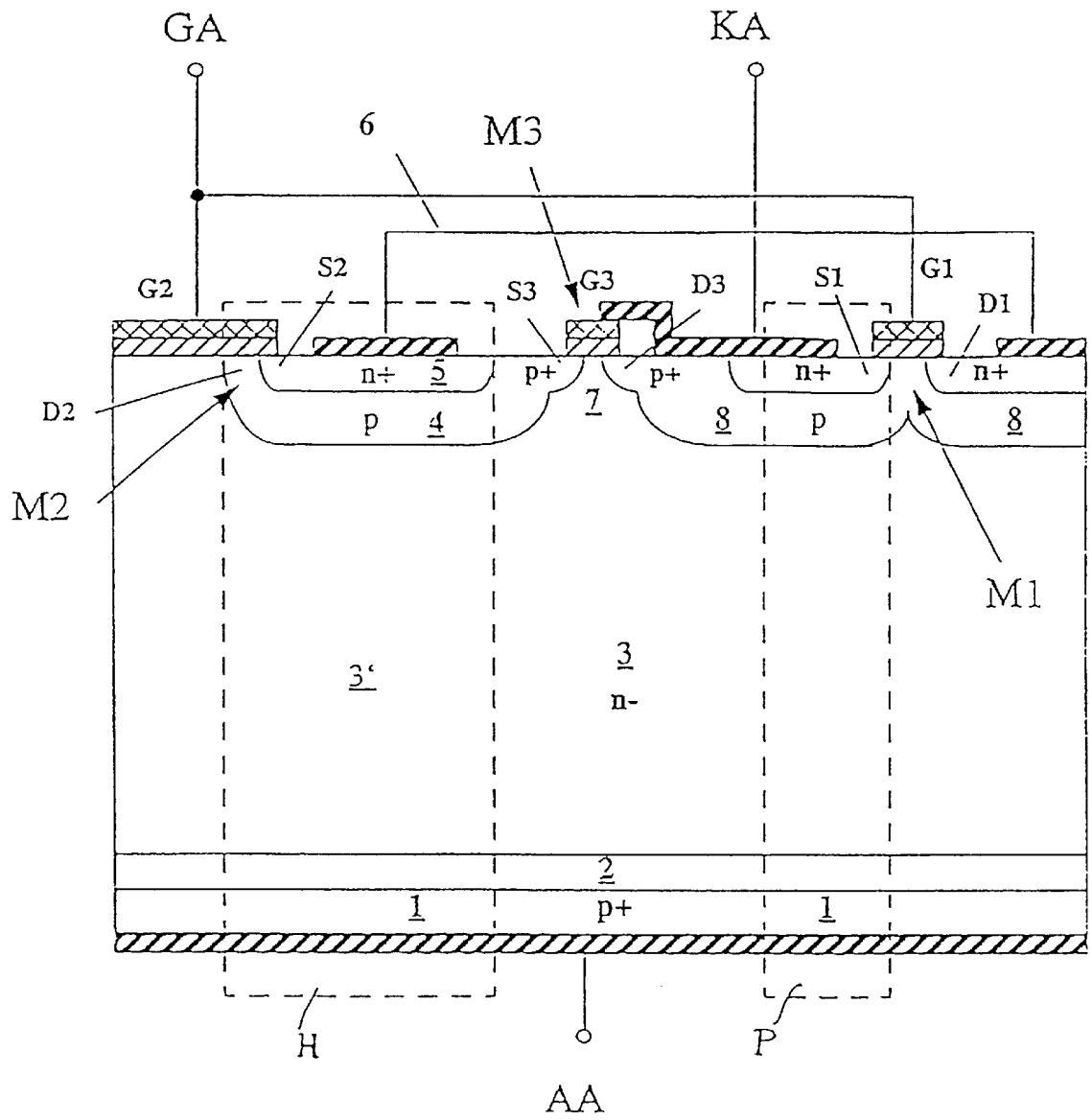
FIG. 6 a vertical embodiment of the component.

As shown in FIG. 6, a vertical component can likewise be realized with the invention. In comparison to FIG. 4, the anode is displaced only on the underside of the semiconductor wafer. The parasitic thyristor, whose embodiment is also effectively suppressed in this arrangement, is shown in the right portion of the figure. The mechanisms of the ignition, current limitation and prevention of the latching of the parasitic thyristor do not differ from those explained above in connection with FIG. 2.

The following three advantages can be attained with the invention:

1. The breakdown behavior of the transition from the n+ emitter 5 to the p base 4 is improved during the turn-off process.
2. The PMOSFET M3 is turned on by a relatively-high voltage at the n base 3, the zone representing the substrate region of M3. Then M3 distributes the holes from the p base 4, which reduces the current through M1. The potential of the p base 4 is consequently also reduced, and the constant voltage drop at M1 leads to an improved current saturation.
3. During turn-off, the holes are bypassed from M3 directly to the cathode. The dynamic latching of the parasitic thyristor is thus suppressed.

The thyristor of the invention comprises an emitter-switched thyristor having a main thyristor TH, which is formed from a p+ anode emitter 1, a drift zone 3' having an opposing conduction type, a zone 4 which, in the turned-off state of the thyristor, has a blocking zone with respect to the drift zone 3', and a cathode-side emitter 5 having, again, a reversed conduction type, resulting in a zone sequence p+n−pn+; a transistor structure T, which is parallel to the main thyristor and comprises three regions of alternating conductivity: an emitter 1, which is identical to the p+ anode emitter 1, an n-doped zone 3 as a base, and a collector region 8; and an NMOSFET M1 for direct actuation of the cathode emitter 5, with the source of this transistor, like the collector region 8, being contacted by a cathode K, which is connected to a cathode connector.

The collector region 8 forms a channel region of the NMOSFET at the surface of the semiconductor, with the associated drain region being connected to the cathode emitter 5 of the main thyristor TH via an electrical conductor 6, and having a turn-on DMOSFET M2, whose gate G2 is connected to the gate G1 of the NMOSFET M1; a source S2, which is likewise contacted by the cathode K, and is embedded in a p base that is identical to the collector region 8; a drain region D2, which is embedded in the n-doped zone 3, with the channel region of the DMOSFET being disposed in the collector region 8; and a PMOSFET M3, whose gate is connected to the cathode and whose drain D3 is a part of the collector region 8, whose source region is connected to the zone 4 of the main thyristor TH and whose channel region is formed by a part of the n-doped zone 3 that borders on the component surface.

The advantage of the component of the invention is that, in contrast to the state of the technology, the gate of the NMOSFET M1 and the gate of the DMOSFET M2 are no longer automatically connected to one another. In the state of the technology, these gates are connected as shown in FIG. 1, so the thyristor is automatically turned on with the gates and, consequently, can break down. In contrast, the thyristor according to the invention is protected, and the current flux through the thyristor remains limited, even at higher voltages.

A further, practical embodiment of the component of the invention involves the complementary configuration of the component, with the conduction types of the individual component regions being replaced by their complementary conduction types and the function of the component zones and electrodes changing accordingly.

What is claimed is:

1. An emitter-switched thyristor having
   a main thyristor (TH), which is formed from a p+ anode emitter (1), a drift zone (3') having an opposing conduction type, a zone (4) which, in the turned-off state of the thyristor, has a blocking zone with respect to the drift zone (3'), and a cathode-side emitter (5) having, again, a reversed conduction type, resulting in a zone sequence p+n–pn+;
   a transistor structure (T), which is parallel to the main thyristor and comprises three regions of alternating conductivity: an emitter (1), which is identical to the p+ anode emitter (1), an n-doped zone (3) as a base, a collector region (8); and
   an NMOSFET (M1) for direct actuation of the cathode-side emitter (5), with the source of this transistor, like the collector region (8), being contacted by a cathode (K), which is connected to a cathode connector;
   a turn-on DMOSFET (M2), whose gate (G2) is connected to a gate (G1) of the NMOSFET (M1); a source (S2), which is likewise contacted by the cathode (K), and is embedded in a p base that is identical to the collector region (8); a drain region (D2), which is embedded in the n-doped zone (3), with the channel region of the DMOSFET being disposed in the collector region (8); and
   a PMOSFET (M3), whose gate is connected to the cathode and whose drain (D3) is a part of the collector region (8), whose source region is connected to the zone (4) of the main thyristor (TH) and whose channel region is formed by a part of the n-doped zone (3) that borders on the component surface.

2. The emitter-switched thyristor according to claim 1, wherein the thyristor is embodied as a lateral thyristor, namely the cathode (K), gate (G) and anode (A) are disposed on one side of a semiconductor wafer.

3. The emitter-switched thyristor according to claim 1, wherein the thyristor is embodied as a vertical thyristor, namely the cathode (K) and gate (G) are disposed on the one side, and the anode (A) is disposed on the other side, of a semiconductor wafer.

4. The emitter-switched thyristor according to claim 1, wherein below the cathode metallization (K), an oxide-filled trough that extends down to an insulation layer (I) between the substrate (S) and the semiconductor wafer, and the MOSFET (M2) are disposed between the cathode (K) and the anode (A).

5. The emitter-switched thyristor according to one or more of claim 1, wherein the thyristor has a substrate (S) that is insulated from the actual component.

6. The emitter-switched thyristor according to one or more of claim 1, wherein the thyristor is of a complementary type.

* * * * *